United States Patent
Jung et al.

(10) Patent No.: US 8,198,002 B2
(45) Date of Patent: Jun. 12, 2012

(54) POSITIVE PHOTOSENSITIVE RESIN COMPOSITION

(75) Inventors: Doo-Young Jung, Uiwang-si (KR);
Ji-Young Jeong, Uiwang-si (KR);
Hyun-Yong Cho, Uiwang-si (KR);
Yong-Sik Yoo, Uiwang-si (KR);
Min-Kook Chung, Uiwang-si (KR);
Jong-Hwa Lee, Uiwang-si (KR);
Kil-Sung Lee, Uiwang-si (KR);
Myoung-Hwan Cha, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 170 days.

(21) Appl. No.: 12/581,974

(22) Filed: Oct. 20, 2009

(65) Prior Publication Data
US 2010/0099043 A1    Apr. 22, 2010

(30) Foreign Application Priority Data
Oct. 20, 2008 (KR) .......................... 10-2008-0102568

(51) Int. Cl.
*G03F 7/023* (2006.01)

(52) U.S. Cl. ..... 430/191; 430/192; 430/193; 430/286.1; 430/906

(58) Field of Classification Search .................. 430/191, 430/192, 193, 18, 286.1, 906
See application file for complete search history.

(56) References Cited

U.S. PATENT DOCUMENTS

| | | | |
|---|---|---|---|
| 2,772,975 A | | 12/1956 | Rickers |
| 2,797,213 A | | 6/1957 | Moore |
| 3,669,658 A | | 6/1972 | Yonezawa et al. |
| 5,114,826 A | * | 5/1992 | Kwong et al. ............... 430/192 |
| 5,376,499 A | * | 12/1994 | Hammerschmidt et al. .. 430/192 |
| 5,449,584 A | * | 9/1995 | Banba et al. .................. 430/192 |
| 5,486,447 A | * | 1/1996 | Hammerschmidt et al. .. 430/197 |
| 6,001,517 A | * | 12/1999 | Kawamonzen .................. 430/18 |
| 6,207,356 B1 | * | 3/2001 | Banba et al. ................... 430/326 |
| 6,376,151 B1 | * | 4/2002 | Takahashi et al. ............ 430/326 |
| 7,056,641 B2 | * | 6/2006 | Naiini et al. .................. 430/190 |
| 2004/0142275 A1 | * | 7/2004 | Komatsu .................... 430/270.1 |
| 2004/0229167 A1 | * | 11/2004 | Naiini et al. ............... 430/283.1 |

FOREIGN PATENT DOCUMENTS

| JP | 63-096162 A | 4/1988 |
|---|---|---|
| JP | 09-302221 A | 11/1997 |
| JP | 10-307393 A | 11/1998 |
| JP | 2000-292913 A | 10/2000 |

\* cited by examiner

*Primary Examiner* — John Chu
(74) *Attorney, Agent, or Firm* — Summa, Additon & Ashe, P.A.

(57) ABSTRACT

Disclosed is a positive photosensitive resin composition that includes (A) a first polybenzoxazole precursor that includes: a repeating unit of Chemical Formula 1 and a thermally polymerizable functional group at at least one terminal end; (B) a second polybenzoxazole precursor that includes a repeating unit of Chemical Formula 3; (C) a photosensitive diazoquinone compound; (D) a silane compound; and (E) a solvent.

8 Claims, No Drawings

POSITIVE PHOTOSENSITIVE RESIN COMPOSITION

CROSS-REFERENCE TO RELATED APPLICATION

This application claims priority to and the benefit of Korean Patent Application No. 10-2008-0102568 filed in the Korean Intellectual Property Office on Oct. 20, 2008, the entire disclosure of which is incorporated herein by reference.

FIELD OF THE INVENTION

The present invention relates to a positive photosensitive resin composition.

BACKGROUND OF THE INVENTION

Conventional surface protective layers and interlayer insulating layers for semiconductor devices can include a polyimide resin having excellent heat resistance, electrical characteristics, and mechanical characteristics, among other properties.

Surface protective layers, interlayer insulating layers, and the like including a polyimide resin have recently been formed using a photosensitive polyimide precursor composition. The polyimide precursor composition can be coated on a semiconductor device, patterned by ultraviolet (UV) radiation, developed, and heat imidized. Accordingly, it is possible to significantly shorten process times as compared to process times for conventional non-photosensitive polyimide precursor compositions.

The photosensitive polyimide precursor composition can be a positive type composition in which an exposed part is dissolved by development or a negative type composition in which the exposed part is cured and remains. Positive type photosensitive compositions can be advantageous because they can be developed using a non-toxic alkali aqueous solution.

The positive photosensitive polyimide precursor composition includes a polyimide precursor of polyamic acid and a photosensitive material of diazonaphtoquinone, among other components. However, the use of the positive photosensitive polyimide precursor composition can be problematic because the carbonic acid of the polyamidic acid can be so highly soluble in alkali that it is difficult to obtain a desired pattern.

In order to solve this problem, polyamidic acid can be esterified with an alcohol compound having at least one hydroxyl group to provide a material in which phenolic hydroxyl acid has been introduced instead of carbonic acid (refer to Japanese Patent Laid-Open Publication No H10-307393). This material, however, can be insufficiently developed, which can cause problems such as loss of layer thickness or resin delamination from the substrate.

Recently, a material in which a polybenzoxazole precursor is mixed with a diazonaphtoquinone compound has drawn attention (Japanese Patent Laid-open Publication No. S63-96162). When the polybenzoxazole precursor composition is actually used, however, layer thickness of an unexposed part can significantly decrease, which can make it difficult to obtain a desirable pattern after the developing process. Increasing the molecular weight of the polybenzoxazole precursor can reduce loss of layer thickness of the unexposed part, but development residue (scum) is generated which can deteriorate resolution and increase development times for the exposed part.

In order to solve these problems, it has been reported that loss of layer thickness can be suppressed by adding a certain phenol compound to a polybenzoxazole precursor composition (Japanese Patent Laid-Open Publication No. H9-302221 and Japanese Patent Laid-Open Publication No. 2000-292913). However, the effect of suppressing loss of layer thickness of the unexposed part is insufficient. Accordingly, there is still a need to improve the ability to suppress layer thinning (i.e., to reduce the loss of layer thickness), as well as to prevent the generation of development residue (scum).

In addition, phenols are added to regulate solubility, but they can be decomposed or cause a side reaction at high temperatures during thermal curing, which can significantly damage the mechanical properties of a cured film. Accordingly, there is still a need for a suitable dissolution controlling agent to replace conventional phenols.

Furthermore, when this polyimide or polybenzoxazole precursor composition is used to prepare a thermally cured film, the thermally cured film should have excellent mechanical properties such as tensile strength, elongation, and Young's modulus when it remains in a semiconductor device and acts as a surface protective layer. In particular, as methods for packaging a semiconductor continue to rapidly develop, polyimides and polybenzoxazoles used as surface protective layers should also have improved mechanical properties to complement such new developments. However, polyimide and polybenzoxazole precursors conventionally used in semiconductor devices tend to have insufficient mechanical properties, including insufficient elongation. Accordingly, in order to solve this problem, it has been reported that various additives can be added thereto or a precursor compound that is cross-linkable during the thermal curing can be used.

However, despite improvements in mechanical properties, such as elongation, there remains a need for methods that provide improved mechanical properties without deteriorating photo characteristics such as sensitivity, resolution, and the like.

SUMMARY OF THE INVENTION

An exemplary embodiment of the present invention provides a positive photosensitive, resin composition that has high sensitivity and resolution, good pattern-forming capabilities, low film shrinkage, high residue removal, as well as excellent mechanical properties after thermal curing.

Another embodiment of the present invention provides a photosensitive resin film made using the positive photosensitive resin composition. A further embodiment of the present invention provides a semiconductor device including the photosensitive resin film.

The embodiments of the present invention are not limited to the above technical purposes, and a person of ordinary skill in the art can understand other technical purposes.

According to one embodiment of the present invention, a positive photosensitive resin composition is provided that includes (A) a first polybenzoxazole precursor that includes a repeating unit of the following Chemical Formula 1 and a thermally polymerizable functional group at at least one terminal end; (B) a second polybenzoxazole precursor that includes a repeating unit of the following Chemical Formula 3; (C) a photosensitive diazoquinone compound; (D) a silane compound; and (E) a solvent.

[Chemical Formula 1]

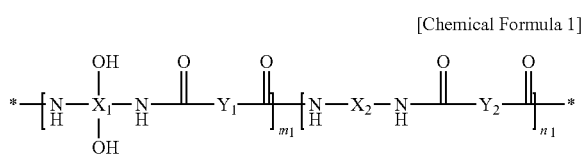

In the above Chemical Formula 1, $X_1$ is an aromatic organic group or a tetravalent to hexavalent alicyclic organic group, $Y_1$ and $Y_2$ are the same or different, and are independently an aromatic organic group or a divalent to hexavalent alicyclic organic group, $X_2$ is an aromatic organic group, a divalent to hexavalent alicyclic organic group, or a functional group represented by the following Chemical Formula 2, $m_1$ and $n_1$ are each mole ratios and $m_1+n_1$ is 100 mol %, $m_1$ ranges from about 60 to about 100 mol %, and $n_1$ ranges from about 0 to about 40 mol %.

[Chemical Formula 2]

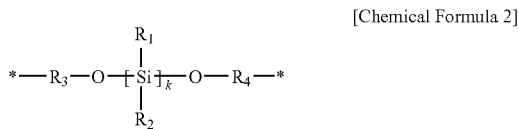

In the above Chemical Formula 2, $R_1$ to $R_2$ are the same or different, and are independently substituted or unsubstituted alkyl, substituted or unsubstituted aryl, substituted or unsubstituted alkoxy, or hydroxy, $R_3$ and $R_4$ are the same or different, and are independently substituted or unsubstituted alkylene or substituted or unsubstituted arylene, and k is an integer ranging from 1 to 50.

[Chemical Formula 3]

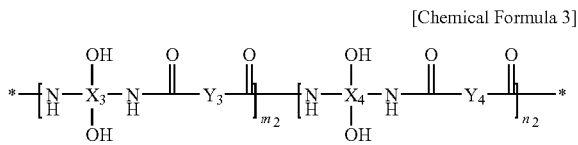

In the above Formula 3, $X_3$ and $X_4$ are the same or different, and are independently an aromatic organic group or a tetravalent to hexavalent alicyclic organic group, $Y_3$ is an aromatic organic group or a divalent to hexavalent alicyclic organic group, and is also a thermally polymerizable organic group, $Y_4$ is an aromatic organic group or a divalent to hexavalent alicyclic organic group, $m_2$ and $n_2$ are each mole ratios and $m_2+n_2$ is 100 mol %, $m_2$ ranges from about 50 to about 100 mol %, and $n_2$ ranges from about 0 to about 50 mol %.

The positive photosensitive resin composition includes the second polybenzoxazole precursor (B) as a dissolution controlling (or solubility controlling) agent to reduce solid content of the first polybenzoxazole precursor.

The first and second polybenzoxazole precursors may independently have a weight average molecular weight (Mw) of about 3000 to about 300,000.

Exemplary solvents include without limitation N-methyl-2-pyrrolidone, γ-butyrolactone, N,N-dimethyl acetamide, dimethylsulfoxide, diethyleneglycol dimethylether, diethyleneglycol diethylether, diethyleneglycol dibutylether, propyleneglycol monomethylether, dipropyleneglycol monomethylether, propyleneglycol monomethyletheracetate, methyl lactate, ethyl lactate, butyl lactate, methyl-1,3-butyleneglycolacetate, 1,3-butyleneglycol-3-monomethylether, methyl pyruvate, ethyl pyruvate, methyl-3-methoxy propionate, and the like, and combinations thereof.

The resin composition may include about 1 to about 30 parts by weight of the second polybenzoxazole precursor (B); about 5 to about 100 parts by weight of the photosensitive diazoquinone compound (C); about 0.1 to about 30 parts by weight of the silane compound (D); and about 100 to about 400 parts by weight of the solvent (E), each based on about 100 parts by weight of the first polybenzoxazole precursor (A).

According to another embodiment of the present invention, a photosensitive resin film made using the positive photosensitive resin composition is provided.

According to a further embodiment of the present invention, a semiconductor device including the photosensitive resin film made using the positive photosensitive resin composition is provided.

Hereinafter, further embodiments of the present invention will be described in detail.

DETAILED DESCRIPTION OF THE INVENTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

The photosensitive resin composition according to one embodiment of the present invention includes (A) a first polybenzoxazole precursor that includes: a repeating unit of the following Chemical Formula 1 and a thermally polymerizable functional group at at least one terminal end; (B) a second polybenzoxazole precursor that includes a repeating unit of the following Chemical Formula 3; (C) a photosensitive diazoquinone compound; (D) a silane compound; and (E) a solvent.

As used herein, when a specific definition is not otherwise provided, the term "substituted" refers to one substituted with at least one or more substituents selected from halogen, alkyl, aryl, alkoxy, amino, alkenyl, or combinations thereof.

As used herein, when a specific definition is not otherwise provided, the term "alkyl" refers to C1 to C30 alkyl, for example, C1 to C15 alkyl, the term "aryl" refers to C6 to C30 aryl, for example, C6 to C18 aryl, the term "alkenyl" refers to C2 to C30 alkenyl, for example, C2 to C15 alkenyl, and the term "alkoxy" refers to C1 to C30 alkoxy, for example, C1 to C15 alkoxy.

Also as used herein, when a specific definition is not otherwise provided, the term "alkylene" refers to C1 to C30 alkylene, for example, C1 to C15 alkylene, and the term "arylene" refers to C6 to C30 arylene, for example, C6 to C18 arylene.

As used herein, when a specific definition is not otherwise provided, the terms "divalent to hexavalent alicyclic organic group" and "tetravalent to hexavalent alicyclic organic group" respectively refer to an alicyclic organic group including 2 to 6 functional groups and an alicyclic organic group including 4 to 6 functional groups. The functional groups are substituents excluding hydrogen.

As used herein, when a specific definition is not otherwise provided, the term "alicyclic organic group" refers to a C3 to C30 cycloalkyl, a C3 to C30 cycloalkenyl, or a C3 to C30 cycloalkynyl, and the term "aromatic organic group" refers to a C6 to C30 aryl or a C2 to C30 heteroaryl.

As used herein, when a specific definition is not otherwise provided, the term "hetero" refers to one including 1 to 3 heteroatoms selected from the group consisting of N, O, S, and P in one ring.

Each component will hereinafter be described in detail.

(A) First Polybenzoxazole Precursor

The first polybenzoxazole precursor includes a repeating unit of the following Chemical Formula 1 and a thermally polymerizable functional group at at least one terminal end.

[Chemical Formula 1]

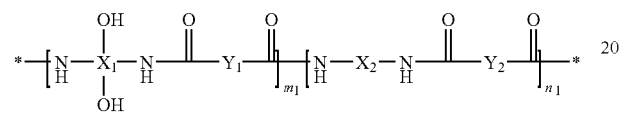

In the above Chemical Formula 1, $X_1$ is an aromatic organic group or a tetravalent to hexavalent alicyclic organic group, $Y_1$ and $Y_2$ are the same or different, and are independently an aromatic organic group or a divalent to hexavalent alicyclic organic group, $X_2$ is an aromatic organic group, a divalent to hexavalent alicyclic organic group, or a functional group represented by the following Chemical Formula 2, $m_1$ and $n_1$ are each mole ratios and $m_1+n_1$ is 100 mol %, $m_1$ ranges from about 60 to about 100 mol %, and $n_1$ ranges from about 0 to about 40 mol %.

[Chemical Formula 2]

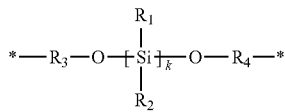

In the above Chemical Formula 2, $R_1$ and $R_2$ are the same or different, and are independently substituted or unsubstituted alkyl, substituted or unsubstituted aryl, substituted or unsubstituted alkoxy, or hydroxy, $R_3$ and $R_4$ are the same or different, and are independently substituted or unsubstituted alkylene or substituted or unsubstituted arylene, and k is an integer ranging from 1 to 50.

$X_1$ may be a moiety derived from 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2'-bis(3-amino-4-hydroxy-5-trifluoromethylphenyl)hexafluoropropane, 2,2'-bis(3-amino-4-hydroxy-6-trifluoromethylphenyl)hexafluoropropane, 2,2'-bis(3-amino-4-hydroxy-2-trifluoromethylphenyl)hexafluoropropane, 2,2'-bis(4-amino-3-hydroxy-5-trifluoromethylphenyl)hexafluoropropane, 2,2'-bis(4-amino-3-hydroxy-6-trifluoromethylphenyl)hexafluoropropane, 2,2'-bis(4-amino-3-hydroxy-2-trifluoromethylphenyl)hexafluoropropane, 2,2'-bis(3-amino-4-hydroxy-5-pentafluoroethylphenyl)hexafluoropropane, 2-(3-amino-4-hydroxy-5-trifluoromethylphenyl)-2'-(3-amino-4-hydroxy-5-pentafluoroethylphenyl)hexafluoropropane, 2-(3-amino-4-hydroxy-5-trifluoromethylphenyl)-2'-(3-hydroxy-4-amino-5-trifluoromethylphenyl)hexafluoropropane, 2-(3-amino-4-hydroxy-5-trifluoromethylphenyl)-2'-(3-hydroxy-4-amino-6-trifluoromethylphenyl)hexafluoropropane, 2-(3-amino-4-hydroxy-5-trifluoromethylphenyl)-2'-(3-hydroxy-4-amino-2-trifluoromethylphenyl)hexafluoropropane, 2-(3-amino-4-hydroxy-2-trifluoromethylphenyl)-2'-(3-hydroxy-4-amino-5-trifluoromethylphenyl)hexafluoropropane, 2-(3-amino-4-hydroxy-6-trifluoromethylphenyl)-2'-(3-hydroxy-4-amino-5-trifluoromethylphenyl)hexafluoropropane, or a combination thereof.

For example, $X_1$ may be a moiety represented by the following Chemical Formula 4 or 5.

[Chemical Formula 4]

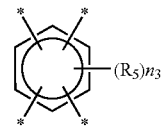

[Chemical Formula 5]

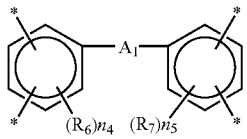

In the above Chemical Formulae 4 and 5, $A_1$ is O, CO, $CR_8R_9$, $SO_2$, S, or a single bond, $R_8$ and $R_9$ are the same or different, and are independently hydrogen or substituted or unsubstituted alkyl, and in one embodiment each $R_8$ and $R_9$ is fluoroalkyl, $R_5$ to $R_7$ are the same or different, and are independently hydrogen or substituted or unsubstituted alkyl, $n_3$ is an integer of 1 or 2, and $n_4$ and $n_5$ are the same or different, and are independently integers ranging from 1 to 3.

Examples of $X_1$ also include the following Chemical Formula 6.

[Chemical Formula 6]

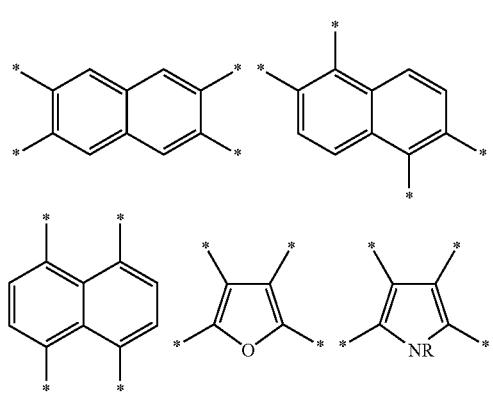

In the above Chemical Formula 6, R is hydrogen or alkyl. $X_1$ may be an alicyclic organic group represented by the following Chemical Formula 7.

[Chemical Formula 7]

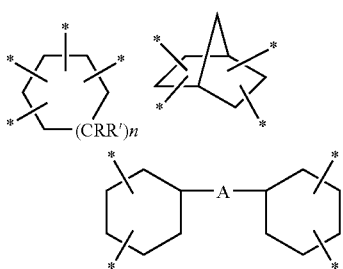

In the above Chemical Formula 7, R and R' are the same or different, and independently hydrogen or alkyl, n is an integer of 0 to 3, and A is O, CO, CRR' (where R and R' are the same or different, and independently hydrogen or alkyl), $SO_2$, or S.

For example, $X_2$ may be a moiety represented by the following Chemical Formula 8 or 9.

[Chemical Formula 8]

[Chemical Formula 9]

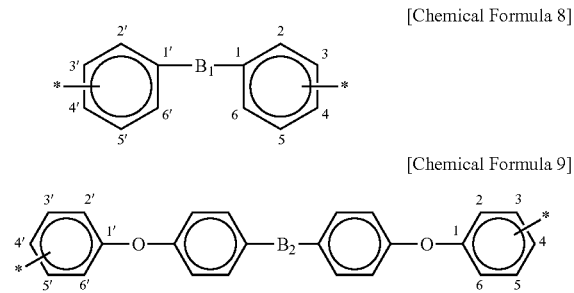

In the above Chemical Formulae 8 and 9, $B_1$ and $B_1$ are O, CO, $CR_8R_9$, $SO_2$, S, or a single bond.

In Chemical Formula 8, $X_2$ may be linked of N of the main chain, at a position 3 or 4 of the aromatic ring when a position linked to $B_1$ is 1. In Chemical Formula 9, $X_2$ may be linked of N of the main chain, at a position 3 or 4 of the aromatic ring when a position linked to O is 1.

For example, $X_2$ may be a moiety represented by the following Formula 10.

[Chemical Formula 10]

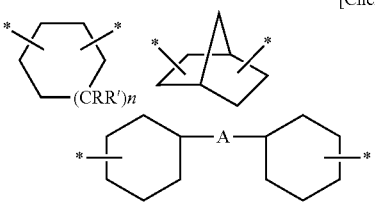

In the above Chemical Formula 10, R and R' are the same or different, and independently hydrogen or alkyl, n is an integer of 0 to 3, and A is independently O, CO, CRR' (where R and R' are the same or different, and independently hydrogen or alkyl), $SO_2$, or S.

$X_2$ may be derived from an aromatic diamine, a silicon diamine, or an alicyclic diamine, but is not limited thereto.

Examples of the aromatic diamine include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenyl sulfide, benzidine, m-phenylenediamine, p-phenylenediamine, 1,5-naphthalenediamine, 2,6-naphthalenediamine, bis[4-(4-aminophenoxy)phenyl]sulfone, bis[4-(3-aminophenoxy)phenyl]sulfone, bis[4-(4-amino)phenoxy]biphenyl, bis[4-(4-aminophenoxy)phenyl]ether, 1,4-bis(4-aminophenoxy)benzene, and the like, and combinations thereof.

Examples of the silicon diamine include without limitation bis(4-aminophenyloxy)dimethylsilane, bis(4-aminophenyloxy)diethylsilane, bis(4-aminophenyloxy)dipropylsilane, bis(4-aminophenyloxy)diphenylsilane, 1,3-bis(aminopropyloxy)dimethylsilane, 1,3-bis(aminopropyloxy)diethylsilane, 1,3-bis(aminopropyloxy)dipropylsilane, 1,3-bis(aminopropyloxy)diphenylsilane, and the like, and combinations thereof.

Examples of the alicyclic diamine include without limitation cyclohexyldiamine, methylenebiscyclohexylamine, and the like, and combinations thereof.

The aromatic diamine, silicon diamine, or alicyclic diamine may respectively be used singularly or in combination, and combinations of the aromatic diamine, silicon diamine, or alicyclic diamine may also be used.

$Y_1$ and $Y_2$ are moieties derived from dicarboxylic acid derivatives.

Examples of the dicarboxylic acid derivatives include without limitation active compounds such as carbonyl halide derivatives or active ester derivatives obtained by reacting $Y(COOH)_2$ and 1-hydroxy-1,2,3-benzotriazole. Specific examples of the dicarboxylic acid derivatives include without limitation 4,4'-oxydibenzonyl chloride, diphenyloxydicarbonyl dichloride, bis(phenylcarbonyl chloride)sulfone, bis(phenyl carbonyl chloride)ether, bis(phenyl carbonyl chloride)phenone, phthalic dichloride, terephthalic dichloride, isophthalic dichloride, carbonyl dichloride, diphenyloxy dicarboxylate benzotriazole, and the like, and combinations thereof.

$Y_1$ and $Y_2$ may be moieties represented by the following Formulae 11 to 13.

[Chemical Formula 11]

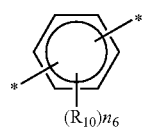

[Chemical Formula 12]

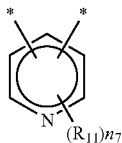

[Chemical Formula 13]

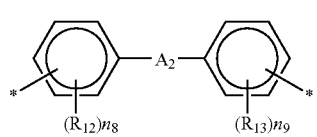

In the above Formulae 11 to 13,
$R_{10}$ to $R_{13}$ are the same or different, and are independently hydrogen or substituted or unsubstituted alkyl,
$n_6$, $n_8$, and $n_9$ are integers ranging from 1 to 4, and $n_7$ is an integer of 1 to 3, and
$A_2$ is O, $CR_{14}R_{15}$, CO, CONH, S, or $SO_2$, wherein $R_{14}$ and $R_{15}$ are the same or different, and are independently hydrogen, substituted or unsubstituted alkyl, or fluoroalkyl.

$Y_1$ and $Y_2$ may be also moieties represented by the following Chemical Formula 14.

[Chemical Formula 14]

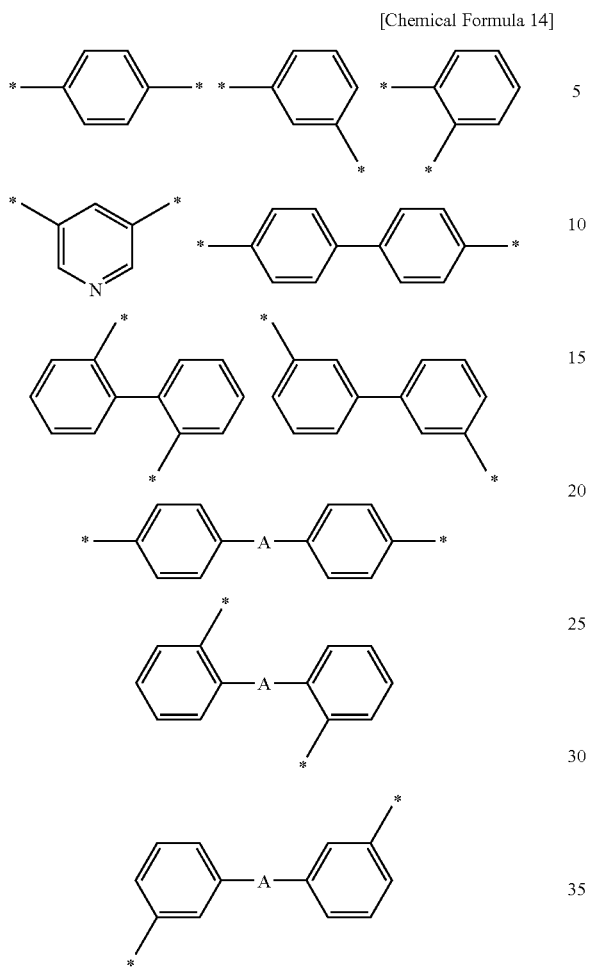

[Chemical Formula 15]

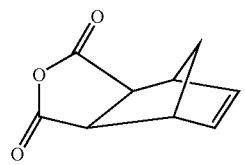

[Chemical Formula 16]

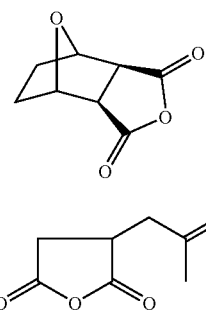

[Chemical Formula 17]

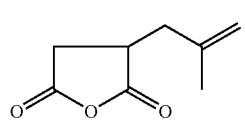

Examples of the thermally polymerizable functional group of the first polybenzoxazole precursor may be represented by the following Chemical Formulae 18 to 22. The thermally polymerizable functional group may be cross-linked during a heating process.

[Chemical Formula 18]

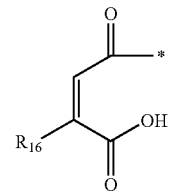

In the Chemical Formula 14, A is O, $CR_{14}R_{15}$, CO, CONH, S, or $SO_2$, wherein $R_{14}$ and $R_{15}$ are the same or different, and are independently hydrogen, substituted or unsubstituted alkyl, or fluoroalkyl.

The first polybenzoxazole precursor includes a thermally polymerizable functional group derived from reactive end-capping monomers at either one or both ends of the branched terminal end.

The reactive end-capping monomers include monoamines including a carbon-carbon double bond or monoanhydrides, or combinations thereof.

Examples of the monoamines include without limitation toluidine, dimethylaniline, ethylaniline, aminophenol, aminobenzyl alcohol, aminoindan, aminoacetonephenone, and the like, and combinations thereof.

Examples of the monoanhydrides include without limitation 5-norbornene-2,3-dicarboxyl anhydride of the following Chemical Formula 15, 3,6-epoxy-1,2,3,6-tetrahydrophthalic anhydride of the following Chemical Formula 16, isobutenyl succinic anhydride of the following Chemical Formula 17, maleic anhydride, aconitic anhydride, 3,4,5,6-tetrahydrophthalic anhydride, cis-1,2,3,6-tetrahydrophthalic anhydride, itaconic anhydride (IA), citraconic anhydride (CA), 2,3-dimethylmaleic anhydride (DMMA), and the like, and combinations thereof.

In the above Chemical Formula 18, $R_{16}$ is H, $CH_2COOH$, or $CH_2CHCHCH_3$.

[Chemical Formula 19]

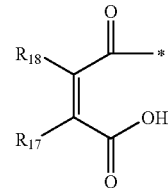

In the above Chemical Formula 19, $R_{17}$ and $R_{18}$ are the same or different, and are independently H or $CH_3$.

[Chemical Formula 20]

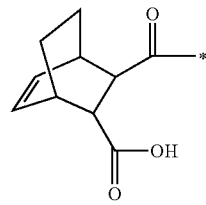

[Chemical Formula 21]

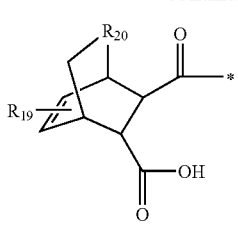

In the above Chemical Formula 21, $R_{19}$ is H or $CH_3$, and $R_{20}$ is $CH_2$ or oxygen.

[Chemical Formula 22]

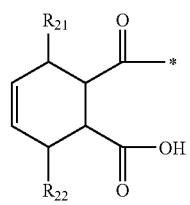

In the above Chemical Formula 22, $R_{21}$ and $R_{22}$ are the same or different, and are independently H, $CH_3$, or $OCOCH_3$.

In one embodiment, the first polybenzoxazole precursor has a weight average molecular weight (Mw) of about 3000 to about 300,000. In one embodiment, the first and second polybenzoxazole precursors may independently have a weight average molecular weight (Mw) of about 5,000 to about 100,000. In one embodiment, the first and second polybenzoxazole precursors may independently have a weight average molecular weight (Mw) of about 5,000 to about 50,000. When the weight average molecular weight is within this range, it is possible to provide sufficient physical properties and excellent solubility to the organic solvent, so as to make it convenient to handle.

(B) Second Polybenzoxazole Precursor

The second polybenzoxazole precursor is represented by the following Formula 3.

[Chemical Formula 3]

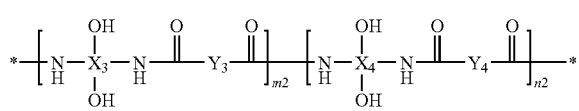

In the above Chemical Formula 3, $X_3$ and $X_4$ are the same or different, and are independently an aromatic organic group or a tetravalent to hexavalent alicyclic organic group, $Y_3$ is an aromatic organic group or a divalent to hexavalent alicyclic organic group, and also a thermally polymerizable organic group, $Y_4$ is an aromatic organic group or a divalent to hexavalent alicyclic organic group, $m_2$ and $n_2$ are each mole ratios and $m_2+n_2$ is 100 mol %, and $m_2$ ranges from about 50 to about 100 mol %, and $n_2$ ranges from about 0 to about 50 mol %, In one embodiment, $m_2$ ranges from about 60 to about 100 mol %, and $n_2$ ranges from about 0 to about 40 mol %. In another embodiment, $m_2$ ranges from about 80 to about 100 mol %, and $n_2$ ranges from about 0 to about 20 mol %.

$X_3$ and $X_4$ may be moieties represented by the following Chemical Formula 23 or 24.

[Chemical Formula 23]

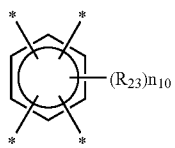

[Chemical Formula 24]

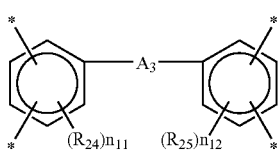

In the above Chemical Formulae 23 and 24, $A_3$ is O, CO, $CR_{26}R_{27}$, $SO_2$, SO, or a single bond, where $R_{26}$ and $R_{27}$ are the same or different, and are independently hydrogen or substituted or unsubstituted alkyl, and in one embodiment, $R_{26}$ and $R_{27}$ are fluoroalkyl, $R_{23}$ to $R_{25}$ are the same or different, and are independently hydrogen or substituted or unsubstituted alkyl, $n_{10}$ is an integer of 1 or 2, and $n_{11}$, and $n_{12}$ are the same or different, and are independently integers of 1 to 3.

$Y_3$ is a thermally polymerizable organic group, and in one embodiment, is a moiety derived from dicarboxylic acid derivatives.

Examples of the dicarboxylic acid derivatives include without limitation active compounds such as carbonyl halide derivatives or active ester derivatives obtained by reacting $Y(COOH)_2$ and 1-hydroxy-1,2,3-benzotriazole. In one embodiment, the dicarboxylic acid derivatives may include a carbon-carbon double bond therein for thermal polymerization.

In another embodiment, tetracarboxylic acid diester dicarboxylic acid derivatives that are obtained by alcohol addition of tetracarboxylic acid dianhydride may be also used. In a further embodiment, tetracarboxylic acid diester dicarboxylic acid that is obtained by performing alcohol addition of an alcohol compound having a thermally polymerizable functional group to tetracarboxylic acid dianhydride may also be used.

Specific examples of the tetracarboxylic acid diester dicarboxylic acid derivatives include without limitation at least one compound of the following Chemical Formulae 25 to 27.

[Chemical Formula 25]

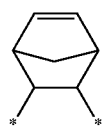

[Chemical Formula 26]

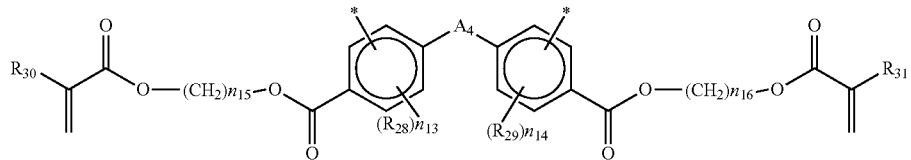

[Chemical Formula 27]

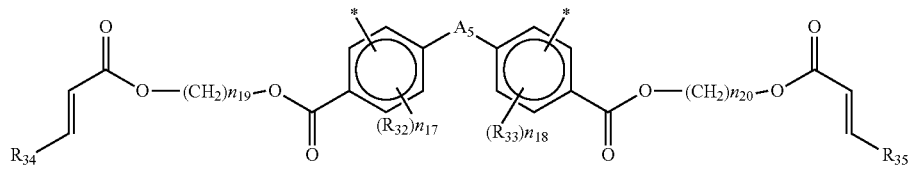

In the above Chemical Formulae 26 and 27, $R_{28}$ to $R_{35}$ are the same or different, and are independently hydrogen, substituted or unsubstituted alkyl, or substituted or unsubstituted aryl, $n_{13}$, $n_{14}$, $n_{17}$, and $n_{15}$ are the same or different and are independently integers of 1 to 4, and $n_{15}$, $n_{16}$, $n_{19}$, and $n_{20}$ are the same or different and are independently integers of 2 to 20, and $A_4$ and $A_5$ are the same or different, and are independently O, CO, or $SO_2$.

More specifically, $Y_3$ may be derived from at least one compound of the following. Chemical Formulae 28 to 33.

[Chemical Formula 28]

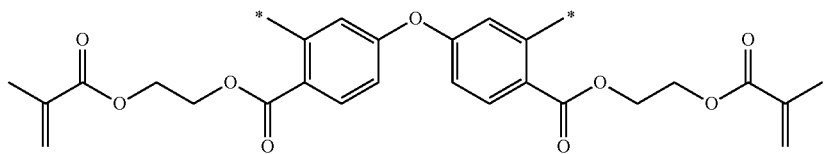

[Chemical Formula 29]

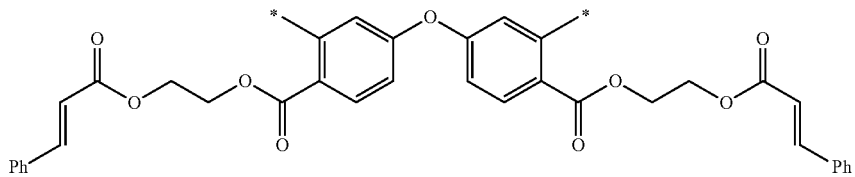

[Chemical Formula 30]

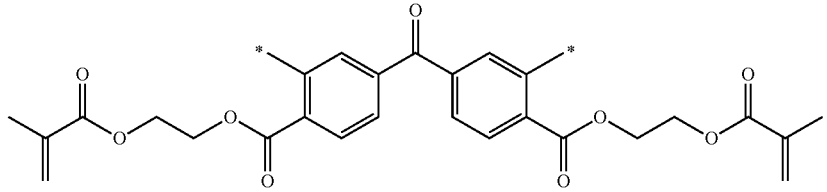

[Chemical Formula 31]

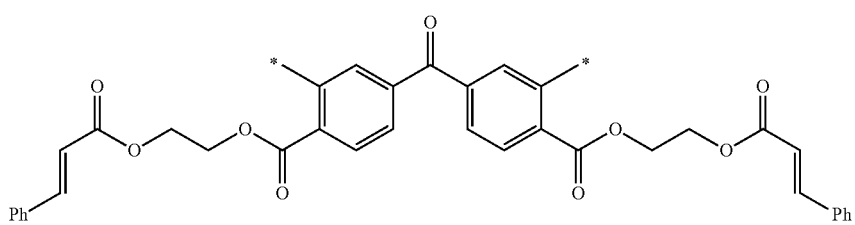

[Chemical Formula 32]

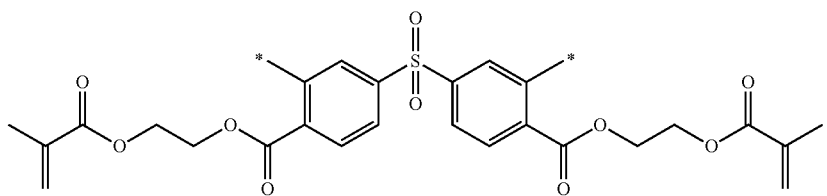

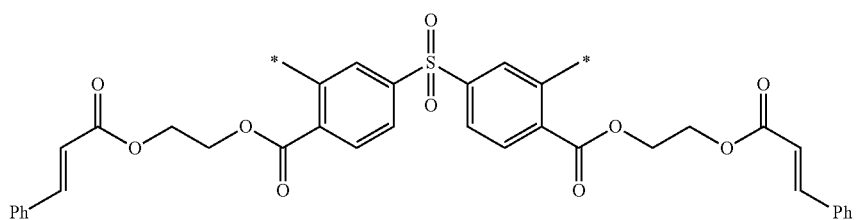

[Chemical Formula 33]

$Y_4$ may be a moiety derived from dicarboxylic acid derivatives. Examples of the dicarboxylic acid derivatives include without limitation active compounds such as carbonyl halide derivatives or active ester derivatives obtained by reacting $Y(COOH)_2$ and 1-hydroxy-1,2,3-benzotriazole. Specific examples of the dicarboxylic acid derivatives include without limitation 4,4'-oxydibenzonyl chloride, diphenyloxydicarbonyl dichloride, bis(phenylcarbonyl chloride)sulfone, bis(phenyl carbonyl chloride)ether, bis(phenyl carbonyl chloride)phenone, phthalic dichloride, terephthalic dichloride, isophthalic dichloride, carbonyl dichloride, diphenyloxy dicarboxylate benzotriazole, and the like, and combinations thereof.

$Y_4$ may be derived from at least one compound of the following Chemical Formulae 34 to 36, but is not limited thereto.

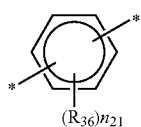

[Chemical Formula 34]

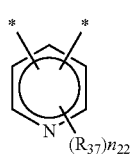

[Chemical Formula 35]

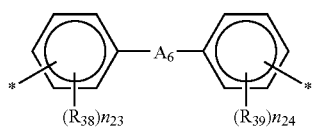

[Chemical Formula 36]

In the above Chemical Formulae 34 to 36, $R_{36}$ to $R_{39}$ are the same or different, and are independently hydrogen or substituted or unsubstituted alkyl, $n_{21}$, $n_{23}$, and $n_{24}$ are integers of 1 to 4, and $n_{22}$ is an integer of 1 to 3, and $A_6$ is O, $CR_{40}R_{41}$, CO, CONH, S, or $SO_2$, where $R_{40}$ and $R_{41}$ are the same or different, and are independently substituted or unsubstituted alkyl, hydrogen, or fluoroalkyl.

The second polybenzoxazole precursor may include a thermally polymerizable functional group derived from reactive end-capping monomers at either one or both ends of the branched terminal end. The thermally polymerizable functional group may be derived from the same monomer as used during preparation of the first polybenzoxazole precursor.

The second polybenzoxazole precursor compound functions as a dissolution controlling agent that increases the dissolution rate of an exposed part and sensitivity, and ensures high resolution patterning without residues (scum) during development by an alkaline aqueous solution for forming a pattern using a photosensitive resin composition. The compound is a polyamic acid ester compound represented by Chemical Formula 3, and thus is cured to a polybenzoxazole compound without decomposition or evaporation resulting in remarkably low film shrinkage during high temperature curing compared to conventional photosensitive resin compositions. Further, since the compound includes thermally polymerizable functional groups distributed in its main chain at a high density, it may increase cross-linking ratios due to reaction between the thermally polymerizable functional groups of the first and second polybenzoxazole precursors, resulting in improvement of mechanical properties of the produced thermally cured film.

The second polybenzoxazole precursor compound may have a weight average molecular weight of about 3000 to about 30,000, and in one embodiment, about 5000 to about 15,000. When the weight average molecular weight is within this range, film thickness loss during development may be minimized or does not occur, sufficient cross-linking may be obtained resulting in improvement of film mechanical properties, a dissolution controlling effect may be realized, and bottom residues after development are also minimized or do not remain.

The second polybenzoxazole precursor compound may be included in an amount of about 1 to about 30 parts by weight, and in one embodiment, about 5 to about 20 parts by weight, based on about 100 parts by weight of the first polybenzoxazole precursor. When the second polybenzoxazole precursor compound is included in the above amount, remaining ratios of a non-exposed part are not reduced and thus resolution is improved since a dissolution inhibition effect does not decrease. Further, appropriate curing is performed to obtain optimal cross-linking ratio resulting in a cured film having excellent mechanical properties.

(C) Photosensitive Diazoquinone Compound

The photosensitive diazoquinone compound may be a compound including a 1,2-benzoquinone diazide or 1,2-naphtoquinone diazide structure. These compounds are described in U.S. Pat. Nos. 2,772,975, 2,797,213, and 3,669,658, the entire content of each of which is incorporated herein by reference.

The photosensitive diazoquinone compound may include the compound represented by the following Chemical Formulae 37 to 39, but is not limited thereto.

[Chemical Formula 37]

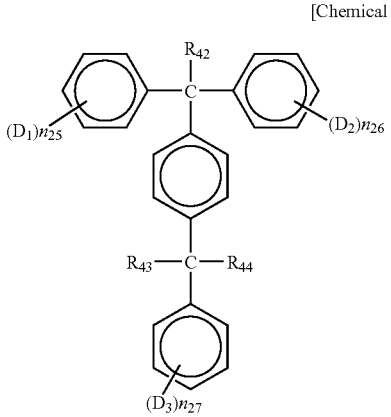

In the above Chemical Formula 37, $R_{42}$ to $R_{44}$ are the same or different, and are independently hydrogen or substituted or unsubstituted alkyl, for example, $CH_3$, $D_1$ to $D_3$ are independently OQ, Q may be hydrogen, or the following Chemical Formula 37-1 or 37-2, provided that all Q are not hydrogen, and $n_{25}$ to $n_{27}$ are the same or different, and are independently integers ranging from 1 to 3.

[Chemical Formula 37-1]

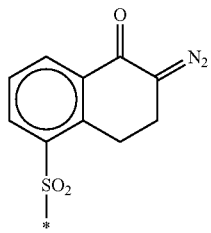

[Chemical Formula 37-2]

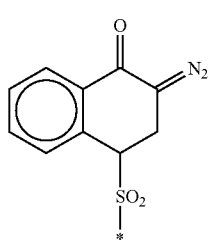

[Chemical Formula 38]

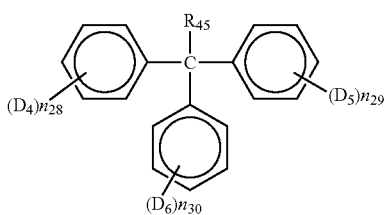

In the above Chemical Formula 38, $R_{45}$ is hydrogen, or substituted or unsubstituted alkyl, $D_4$ to $D_6$ are OQ, where Q is the same as defined in Chemical Formula 37, and $n_{28}$ to $n_{30}$ are the same or different and are independently integers ranging from 1 to 3.

[Chemical Formula 39]

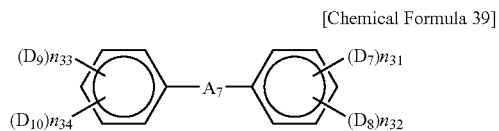

In the above Chemical Formula 39, $A_7$ is CO or $CR_{46}R_{47}$, where $R_{46}$ and $R_{47}$ are the same or independently substituted or unsubstituted alkyl, $D_7$ to $D_{10}$ are the same or different, and are independently hydrogen, substituted or unsubstituted alkyl, OQ, or NHQ, Q is the same as defined in Chemical Formula 37, $n_{31}$, $n_{32}$, $n_{33}$, and $n_{34}$ are the same or different, and are independently integers ranging from 1 to 4, and $n_{31}+n_{32}$ and $n_{33}+n_{34}$ are independently integers of 5 or less, provided that at least one of $D_7$ and $D_8$ is OQ, and one aromatic ring includes one to three OQs and the other aromatic ring includes one to four OQs.

[Chemical Formula 40]

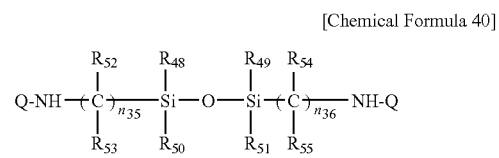

In the above Chemical Formula 40, $R_{48}$ to $R_{55}$ are the same or different, and are independently hydrogen or substituted or unsubstituted alkyl, $n_{35}$ and $n_{36}$ are the same or different, and are integers ranging from 1 to 5, and for example 2 to 4, and Q is the same as defined in Chemical Formula 37.

The photosensitive diazoquinone compound is included in an amount of about 5 to about 100 parts by weight based on about 100 parts by weight of the first polybenzoxazole precursor. Within the above range, residues do not remain after exposure and there is no film thickness loss during development, resulting in good pattern formation.

(D) Silane Compound

The silane compound improves adherence between the photosensitive resin composition and a substrate.

The silane compound may be represented by the following Chemical Formula 41.

[Chemical Formula 41]

In the above Chemical Formula 41, $R_{55}$ is vinyl, substituted or unsubstituted alkyl, or substituted or unsubstituted aryl, for example 3-(meth)acryloxypropyl, p-styryl, or 3-(phenylamino)propyl.

$R_{56}$ to $R_{58}$ are the same or different, and are independently substituted or unsubstituted alkoxy, substituted or unsubstituted alkyl, or halogen, where at least one of $R_{56}$ to $R_{58}$ is alkoxy or halogen, for example the alkoxy may be C1 to C8 alkoxy and the alkyl may be C1 to C20 alkyl.

Examples of the silane compound include without limitation compounds represented by the following Chemical Formulae 42 and 43; a silane compound including an aryl such as trimethoxy[3-(phenylamino)propyl]silane; a silane compound including a carbon-carbon unsaturated bond such as vinyltrimethoxysilane, vinyltriethoxysilane, vinyltrichlorosilane, vinyltris(β-methoxyethoxy)silane, 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyldiethoxysilane, and the like, and combinations thereof.

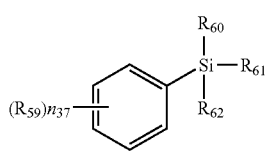

[Chemical Formula 42]

In the above Chemical Formula 42, $R_{59}$ is $NH_2$ or $CH_3CONH$, $R_{60}$ to $R_{62}$ are the same or different, and are independently substituted or unsubstituted alkoxy, for example the alkoxy may be $OCH_3$ or $OCH_2CH_3$, and $n_{37}$ is an integer ranging from 1 to 5.

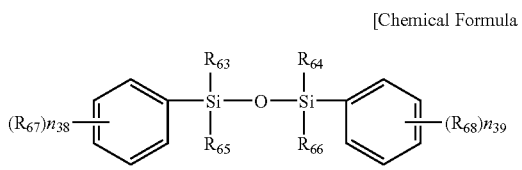

[Chemical Formula 43]

In the above Chemical Formula 43, $R_{63}$ to $R_{66}$ are the same or different, and are independently substituted or unsubstituted alkyl or substituted or unsubstituted alkoxy, for example $CH_3$ or $OCH_3$, $R_{67}$ and $R_{68}$ are the same or different, and are independently substituted or unsubstituted amino, for example $NH_2$ or $CH_3CONH$, and $n_{38}$ and $n_{39}$ are the same or different, and are independently integers ranging from 1 to 5.

The silane compound may be included in an amount of about 0.1 to about 30 parts by weight based on about 100 parts by weight of the first polybenzoxazole precursor. When the silane compound is included in the above-noted amount, adherence between lower and upper layers is sufficient, residue film may not remain after development, and photo characteristics (transmittance), and mechanical properties such as tensile strength, elongation, and Young's modulus may be improved.

(E) Solvent

Examples of the solvent include without limitation N-methyl-2-pyrrolidone, γ-butyrolactone, N,N-dimethyl acetamide, dimethylsulfoxide, diethyleneglycol dimethylether, diethylene glycol diethylether, diethyleneglycol dibutylether, propyleneglycol monomethylether, dipropyleneglycol monomethylether, propyleneglycol monomethyletheracetate, methyl lactate, ethyl lactate, butyl lactate, methyl-1,3-butyleneglycolacetate, 1,3-butyleneglycol-3-monomethylether, methyl pyruvate, ethyl pyruvate, methyl-3-methoxy propionate, and the like, and combinations thereof. The solvent may be used singularly or in combination.

The solvent may be included in an amount of about 100 to about 400 parts by weight, based on about 100 parts by weight of the first polybenzoxazole precursor. Within this range, a sufficiently thick film can be obtained and good solubility and coating can be provided.

(F) Other Additives

The photosensitive resin composition may include (F) other additives in addition to the (A) to (E) components.

For example, the composition can include a latent thermal acid generator. Exemplary latent thermal acid generators include without limitation an arylsulfonic acid such as p-toluene sulfonic acid or a benzene sulfonic acid; a perfluoroalkyl sulfonic acid such as trifluoromethane sulfonic acid or fluorobutane sulfonic acid; an alkane sulfonic acid such as methane sulfonic acid, ethane sulfonic acid, or butane sulfonic acid; and the like; and combinations thereof.

The latent thermal acid generator promotes dehydration reactions of the hydroxyl group-contained polyamide structure of the polybenzoxazole precursor and cyclization, and it promotes the cyclization degree even if the curing temperature is decreased.

In addition, the composition of the invention may further include an additive such as a suitable surfactant or a leveling agent to prevent staining of the film or to improve development.

The process for forming a pattern using a positive photosensitive resin composition can include: coating a positive photosensitive resin composition on a supporting substrate; drying the coated composition to provide a photosensitive polybenzoxazole precursor layer; exposing the photosensitive polybenzoxazole precursor layer to radiation (for example ultraviolet radiation); developing the exposed photosensitive polybenzoxazole precursor layer in an alkali aqueous solution to provide a photosensitive resin film; and heating the photosensitive resin film. The conditions for coating, exposing, and developing a photosensitive resin composition to provide a pattern are widely known in this art, will be understood by the skilled artisan, and accordingly detailed descriptions thereof will not be provided in this specification.

According to another embodiment of the present invention, a photosensitive resin film fabricated using the positive photosensitive resin composition is provided.

According to a further embodiment of the present invention, a semiconductor element including the photosensitive resin film fabricated using the positive photosensitive resin composition is provided. The positive photosensitive resin composition may be used as an insulation layer, a passivation layer, or a buffer coating layer in a semiconductor element. The positive photosensitive resin composition may also be used as a surface protective layer and an interlayer insulating layer in a semiconductor device.

The following examples illustrate the present invention in more detail. However, it is understood that the present invention is not limited by these examples.

SYNTHESIS EXAMPLE 1

Synthesis Polybenzoxazole Precursor (PBO-A)

17.4 g of 2,2-bis(3-amino-4-hydroxyphenyl)-1,1,1,3,3,3-hexafluoro propane and 0.86 g of 1,3-bis(aminopropyloxy) dimethylsilane are dissolved in 280 g of N-methyl-2-pyrrolidone (NMP) in a four-necked flask mounted with an agitator, a temperature controlling device, a nitrogen gas injector, and a condenser, while nitrogen is passed therethrough. The solution includes a solid in an amount of 9 wt %.

When the solid is completely dissolved, 9.9 g of pyridine is added to the solution. Another solution is prepared by dissolving 13.3 g of 4,4'-oxydibenzonylchloride in 142 g of N-methyl-2-pyrrolidone (NMP), and this solution is slowly added in a dropwise fashion to the former solution for 30 minutes, while the former solution is maintained at a temperature ranging from 0 to 5° C. Next, the reaction is performed for 1 hour at a temperature ranging from 0 to 5° C., and then the resulting solution is heated to room temperature and agitated for one hour.

Then, 1.6 g of 5-norbornene-2,3-dicarboxyl anhydride is added thereto. The resulting product is agitated at 70° C. for 24 hours, completing the reaction. The mixture is added to a solution prepared by mixing water/methanol in a volume ratio of 10/1 to produce a precipitate. The precipitate is filtrated, cleaned with water, and dried at 80° C. under vacuum for 24 hours or more, preparing a polybenzoxazole precursor (PBO-A) having a weight average molecular weight of 10,700 and represented by the following Chemical Formula 1a (n and m show mole ratios, and herein, m=0.95 and n=0.05).

dropwise fashion to the former solution for 30 minutes. The mixed solution is reacted for 1 hour at a temperature ranging from 0 to 5° C., and then heated to room temperature and reacted for one hour.

Next, 1.2 g of 5-norbornene-2,3-dicarboxyl anhydride is added thereto and agitated at 70° C. for 24 hours, completing the reaction. The mixture is added to a solution prepared by mixing water/methanol in a volume ratio of 10/1 to produce a precipitate. The precipitate is filtrated, cleaned with water, and dried at 80° C. under vacuum for 24 hours, preparing a polybenzoxazole precursor (PBO-$B_1$) having a weight average molecular weight of 7,500 and represented by the following Chemical Formula 1b.

[Chemical Formula 1a]

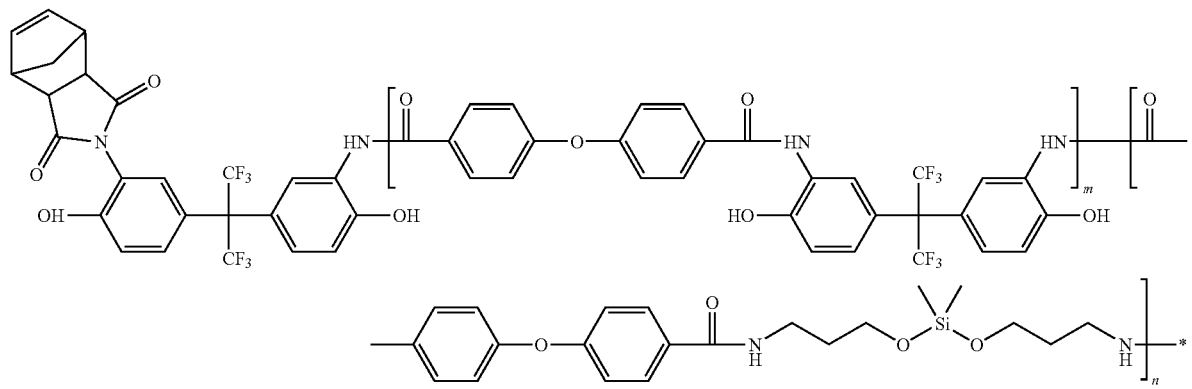

SYNTHESIS EXAMPLE 2

Synthesis of a Polybenzoxazole Precursor (PBO-$B_1$)

10.1 g of 2,2-bis(3-amino-4-hydroxyphenyl)-1,1,1,3,3,3-hexafluoro propane is dissolved in 111.1 g of N-methyl-2-pyrrolidone (NMP) in a four-necked flask mounted with an agitator, a temperature controlling device, a nitrogen gas injector, and a condenser, while nitrogen is passed therethrough. The solution includes a solid in an amount of 9 wt %.

In order to completely dissolve the solid, 4.2 g of pyridine is added to the solution. The resulting mixture is maintained at a temperature ranging from 0 to 5° C. Another solution is prepared by dissolving 5.78 g of trans-3,6-endomethylene-1,2,3,6-tetrahydrophthaloyl chloride in 100 g of N-methyl-2-pyrrolidone (NMP) and this solution is slowly added in a

[Chemical Formula 1b]

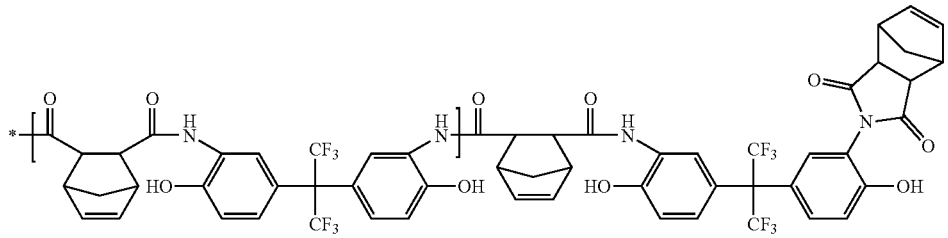

SYNTHESIS EXAMPLE 3

Synthesis of a Polybenzoxazole Precursor (PBO-$B_2$)

10.1 g of 2,2-bis(3-amino-4-hydroxyphenyl)-1,1,1,3,3,3-hexafluoro propane is dissolved in 111.1 g of N-methyl-2-pyrrolidone (NMP) in a four-necked flask mounted with an agitator, a temperature controlling device, a nitrogen gas injector, and a condenser, while nitrogen is passed therethrough. The solution includes a solid in an amount of 9 wt %.

When the solid is completely dissolved, 4.2 g of pyridine is added to the solution. The resulting mixture is maintained at a temperature ranging from 0 to 5° C. Another solution is prepared by dissolving 2.89 g of trans-3,6-endomethylene-1,2,3,6-tetrahydrophthaloyl chloride and 3.9 g of 4,4'-oxy-dibenzonylchloride in 100 g of N-methyl-2-pyrrolidone (NMP), and this solution is added to the former solution in a dropwise fashion for 30 minutes. The mixed solution is reacted for 1 hour at a temperature ranging from 0 to 5° C. and then heated to room temperature and reacted for 1 hour.

Next, 1.2 g of 5-norbornene-2,3-dicarboxyl anhydride is added thereto. The resulting mixture is agitated at 70° C. for 24 hours, completing the reaction.

The mixture is added to a solution of water/methanol mixed in a volume ratio of 10/1 to produce a precipitate. The precipitate is filtrated, sufficiently cleaned with water, and dried at 80° C. under vacuum for more than 24 hours, preparing a polybenzoxazole precursor having a weight average molecular weight of 6800 and represented by the following Chemical Formula 1c (n and m are mole ratios, and herein, m=0.5 and n=0.5)

[Chemical Formula 1c]

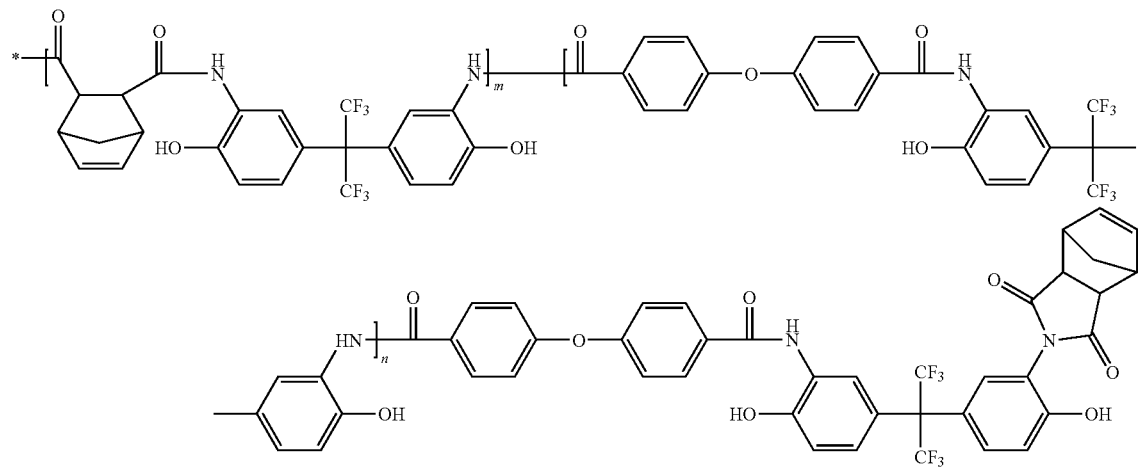

SYNTHESIS EXAMPLE 4

Synthesis of a Polybenzoxazole Precursor (PBO-B$_3$)

10.1 g of 2,2-bis(3-amino-4-hydroxyphenyl)-1,1,1,3,3,3-hexafluoro propane is dissolved in 111.1 g of N-methyl-2-pyrrolidone (NMP) in a four-necked flask mounted with an agitator, a temperature controlling device, a nitrogen gas injector, and a condenser, while nitrogen is passed therethrough. The solution includes a solid in an amount of 9 wt %.

When the solid is completely dissolved, 4.2 g of pyridine is added to the solution. The resulting mixture is maintained at a temperature ranging from 0 to 5° C. Another solution is prepared by dissolving 4.34 g of trans-3,6-endomethylene-1,2,3,6-tetrahydrophthaloyl chloride and 1.95 g of 4,4'-oxy-dibenzonylchloride in 100 g of N-methyl-2-pyrrolidone (NMP), and this solution is slowly added to the former solution for 30 minutes in a dropwise fashion. The resulting solution is reacted for one hour at a temperature ranging from 0 to 5° C., and then heated to room temperature and reacted for one hour.

Next, 1.2 g of 5-norbornene-2,3-dicarboxyl anhydride is added thereto. The resulting product is agitated at 70° C. for 24 hours, completing the reaction. The mixture is added to a solution of water/methanol in a volume ratio of 10/1 to produce a precipitate. The precipitate is filtrated, cleaned with water, and then dried at 80° C. under vacuum for 24 hours or more, preparing a polybenzoxazole precursor having a weight average molecular weight of 7000 and represented by the following Chemical Formula 1d (n and m are mole ratios, and herein, m=0.8 and n=0.2).

[Chemical Formula 1d]

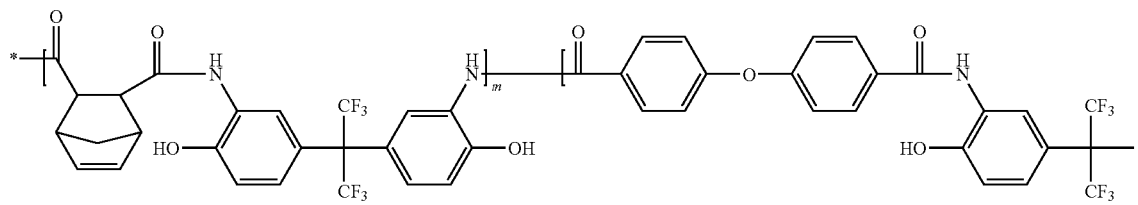

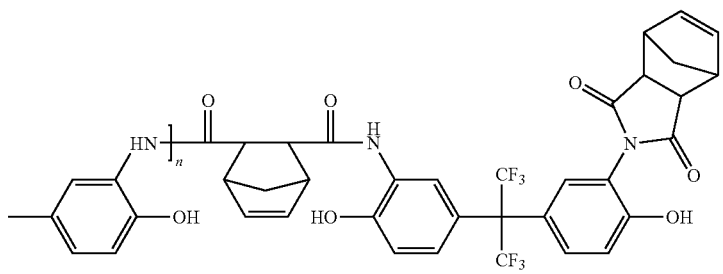

SYNTHESIS EXAMPLE 5

Synthesis of Polybenzoxazole Precursor (PBO-B$_4$)

10.1 g of 2,2-bis(3-amino-4-hydroxyphenyl)-1,1,1,3,3,3-hexafluoro propane is dissolved in 111.1 g of N-methyl-2-pyrrolidone (NMP) in a four-necked flask mounted with an agitator, a temperature controlling device, a nitrogen gas injector, and a condenser, while nitrogen is passed therethrough. The solution includes a solid in an amount of 9 wt %.

When the solid is completely dissolved, 4.2 g of pyridine is added thereto. The resulting mixture is maintained at a temperature ranging from 0 to 5° C. Another solution is prepared by dissolving 6.18 g of trans-3,6-endomethylene-1,2,3,6-tetrahydrophthaloyl chloride in 100 g of N-methyl-2-pyrrolidone (NMP), and this solution is slowly added to the former solution in a dropwise fashion for 30 minutes. The mixed solution is reacted at a temperature ranging from 0 to 5° C. for one hour, and then heated to room temperature and reacted for 1 hour.

Next, 1.2 g of 5-norbornene-2,3-dicarboxyl anhydride is added thereto. The resulting mixture is agitated at 70° C. for 24 hours, completing the reaction. Then, the mixture is added to a solution of water/methanol in a volume ratio of 10/1 to produce a precipitate. The precipitate is filtrated, cleaned with water, and dried at 80° C. under vacuum for 24 hours, preparing a polybenzoxazole precursor with a weight average molecular weight of 9100 and represented by the following Chemical Formula 1e.

[Chemical Formula 1e]

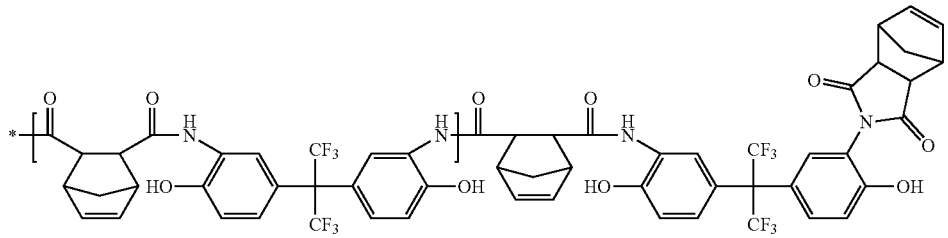

SYNTHESIS EXAMPLE 6

Synthesis of Polybenzoxazole Precursor (PBO-B$_5$)

10.1 g of 2,2-bis(3-amino-4-hydroxyphenyl)-1,1,1,3,3,3-hexafluoro propane is dissolved in 111.1 g of N-methyl-2-pyrrolidone (NMP) in a four-necked flask mounted with an agitator, a temperature controlling device, a nitrogen gas injector, and a condenser, while nitrogen is passed therethrough. The solution includes a solid in an amount of 9 wt %.

When the solid is completely dissolved, 4.2 g of pyridine is added thereto. The resulting mixture is maintained at a temperature ranging from 0 to 5° C. Another solution is prepared by dissolving 3.09 g of trans-3,6-endomethylene-1,2,3,6-tetrahydrophthaloyl chloride and 4.16 g of 4,4'-oxydibenzonyl-chloride in 100 g of N-methyl-2-pyrrolidone (NMP), and this solution is slowly added to the former solution in a dropwise fashion for 30 minutes. The mixed solution is reacted at a temperature ranging from 0 to 5° C. for one hour, and then heated to room temperature and reacted for 1 hour.

Next, 1.2 g of 5-norbornene-2,3-dicarboxyl anhydride is added thereto. The resulting mixture is agitated at 70° C. for 24 hours, completing the reaction. The mixture is added to a solution of water/methanol mixed in a volume ratio of 10/1 to produce a precipitate. The precipitate is filtrated, cleaned with water, and dried at 80° C. under vacuum for 24 hours, preparing a polybenzoxazole precursor having a weight average molecular weight of 9900 and represented by the following Chemical Formula 1f (n and m are mole ratios, and herein, m=0.5 and n=0.5).

[Chemical Formula 1f]

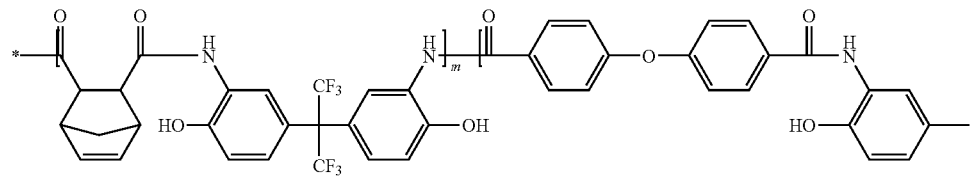
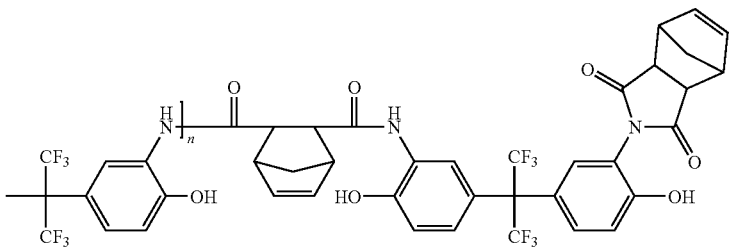

EXAMPLE 1

10 g of the polybenzoxazole precursor (PBO-A) according to Synthesis Example 1 is dissolved in 35.0 g of γ-butyrolactone (GBL). Then, 1 g of photosensitive diazoquinone represented by the following Chemical Formula 37a, 0.02 g of trimethoxy[3-(phenylamino)propyl]silane represented by the following Chemical Formula 41a, and 0.5 g of the second polybenzoxazole precursor (PBO-$B_1$) according to Synthesis Example 2 are dissolved therein. The resulting product is filtrated with a 0.45 μm fluorine resin filter, preparing a positive photosensitive resin composition.

[Chemcial Formula 37a]

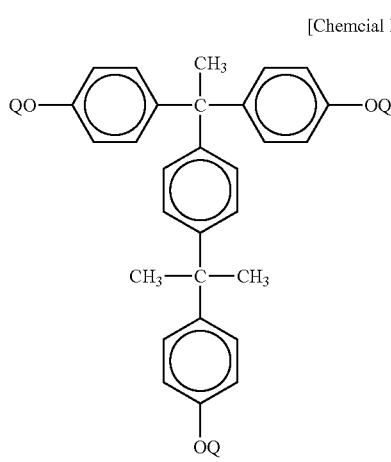

In the above Chemical Formula 37a, two of $Q_1$, $Q_2$, and $Q_3$ are substituted with the following Chemical Formula 37-1, and the remaining one is hydrogen.

[Chemical Formula 37-1]

[Chemical Formula 41a]

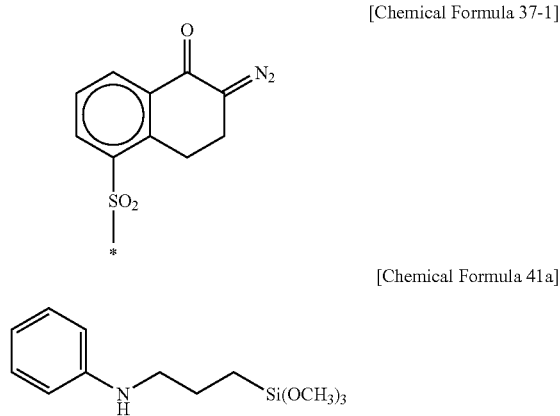

EXAMPLE 2

A positive photosensitive resin composition is prepared according to the same method as Example 1 except for replacing the 0.5 g of the polybenzoxazole precursor (PBO-$B_1$) with a polybenzoxazole precursor (PBO-$B_2$).

EXAMPLE 3

A positive photosensitive resin composition is prepared according to the same method as Example 1 except for replacing the 0.5 g of the polybenzoxazole precursor (PBO-$B_1$) with a polybenzoxazole precursor (PBO-$B_3$).

EXAMPLE 4

A positive photosensitive resin composition is prepared according to the same method as Example 1 except for replacing the 0.5 g of the polybenzoxazole precursor (PBO-$B_1$) with a polybenzoxazole precursor (PBO-$B_4$).

EXAMPLE 5

A positive photosensitive resin composition is prepared according to the same method as Example 1 except for replacing the 0.5 g of the polybenzoxazole precursor (PBO-$B_1$) with a polybenzoxazole precursor (PBO-$B_5$).

EXAMPLE 6

10 g of the polybenzoxazole precursor (PBO-A) according to Synthesis Example 1 is dissolved in 35.0 g of γ-butyrolactone (GBL), and 1 g of photosensitive diazoquinone having the above Chemical Formula 37a, 0.02 g of trimethoxy[3-(phenylamino)propyl]silane having the above Chemical Formula 41a, and 1.1 g of the polybenzoxazole precursor (PBO-$B_1$) of Synthesis Example 2 are added thereto. The resulting mixture is filtrated with a 0.45 μm fluorine resin filter, preparing a positive photosensitive resin composition.

EXAMPLE 7

A positive photosensitive resin composition is prepared according to the same method as Example 6 except for replacing the 1.1 g of the polybenzoxazole precursor (PBO-$B_1$) according to Synthesis Example 2 with the polybenzoxazole precursor (PBO-$B_2$) of Synthesis Example 3.

EXAMPLE 8

A positive photosensitive resin composition is prepared according to the same method as Example 6 except for replacing the 1.1 g of the polybenzoxazole precursor (PBO-$B_1$) according to Synthesis Example 2 with the polybenzoxazole precursor (PBO-$B_3$) of Synthesis Example 4.

COMPARATIVE EXAMPLE 1

A positive photosensitive resin composition is prepared according to the same method as Example 1 except for not using 0.5 g of the polybenzoxazole precursor (PBO-$B_1$) according to Synthesis Example 2.

COMPARATIVE EXAMPLE 2

A positive photosensitive resin composition is prepared according to the same method as Example 1 except for replacing the 0.5 g of the polybenzoxazole precursor (PBO-$B_1$) according to Synthesis Example 2 with a 4-n-hexylresorcinol compound represented by the following Chemical Formula 44.

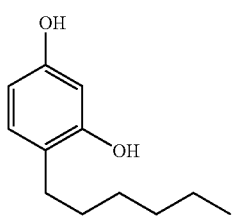

[Chemical Formula 44]

COMPARATIVE EXAMPLE 3

A positive photosensitive resin composition is prepared according to the same method as Example 1 except for replacing the 0.5 g of the polybenzoxazole precursor (PBO-B$_1$) according to Synthesis Example 2 with a bisphenol-A compound represented by the following Chemical Formula 45.

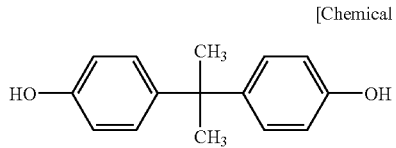

[Chemical Formula 45]

Property Measurement

The photosensitive polybenzoxazole precursor compositions according to Examples 1 to 8 and Comparative Example 3 are coated on an 8-inch wafer by using a spin-coater (1H-DX2) made by Mikasa Co. The resulting product is heated at 130° C. for 2 minutes, fabricating a photosensitive polyimide precursor film.

The polyimide precursor film is exposed to light by using a mask having a various-sized pattern with an I-line stepper (NSR i10C) made by Japanese Nikon Co. The exposed part is dissolved and removed in a 2.38% tetramethyl ammonium hydroxide aqueous solution for 40 seconds through two puddles and washed with pure water for 30 seconds. Next, the acquired pattern is cured in an oxygen concentration of less than 1000 ppm by using an electric heater at 150° C. for 30 minutes and then at 320° C. for 30 minutes, fabricating a patterned film.

The resolution of the film pattern can be identified with an optical microscope. Its pre-firing, development, and thickness change after hardening were measured by using ST4000-DLX equipment made by KMAC Co. The results are provided in the following Table 1.

The film thickness loss rate after the development has an influence on developability and final film thickness. The film thickness change is measured by dipping the film in a 2.38% tetramethyl ammonium hydroxide (TMAH) aqueous solution every hour and washing it with water. The results are provided in the following Table 1.

Furthermore, its sensitivity and resolution are measured. The results are provided in the following Table 1.

The sensitivity is evaluated by using an optimal exposure time calculated by measuring an exposure time in which the 10 μmL/S pattern has a 1:1 line width after exposure and development The resolution is evaluated by using a least pattern dimension in the optimal exposure time.

After forming the pattern, the film is heated under a nitrogen atmosphere at 120° C. for 30 minutes, and then heated to 320° C. for 1 hour and heated at 320° C. for 1 hour again, preparing a cured film. The film has a decreased thickness compared with the one before the curing. Herein, the film thickness after the curing is important, so that the film can be used as a buffer coating layer, an interlayer insulating layer, and a surface protective layer. Accordingly, the less the film has a thickness change, the better. The thickness change is provided by calculating a thickness difference percentage before and after the firing into a contraction rate. The thickness is measured by using ST4000-DLX equipment made by KMAC Co. The results are provided in the following Table 1.

TABLE 1

| | Film thickness (μm) | | | Sensitivity (mJ/cm$^2$) | Resolution (μm) | Film thickness change during development (μm) | Shrinkage ratio (%) |
|---|---|---|---|---|---|---|---|
| | Prebaking | After development | After thermal curing | | | | |
| Example 1 | 9.5 | 8.3 | 6.97 | 390 | 5 | 1.2 | 16 |
| Example 2 | 9.4 | 8.3 | 6.81 | 390 | 2 | 1.1 | 18 |
| Example 3 | 8.7 | 7.4 | 6.14 | 370 | 3 | 1.3 | 17 |
| Example 4 | 9.3 | 8.2 | 6.81 | 370 | 5 | 1.1 | 17 |
| Example 5 | 8.9 | 7.7 | 6.31 | 370 | 3 | 1.2 | 18 |
| Example 6 | 9.7 | 8.6 | 7.14 | 360 | 2 | 1.1 | 17 |
| Example 7 | 9.6 | 8.4 | 7.06 | 410 | 3 | 1.2 | 16 |
| Example 8 | 9.8 | 8.4 | 6.89 | 350 | 2 | 1.4 | 18 |
| Comparative Example 1 | 8.6 | 6.5 | 5.46 | 450 | 7 | 2.1 | 19 |
| Comparative Example 2 | 9.2 | 8.0 | 6.16 | 410 | 7 | 1.2 | 23 |
| Comparative Example 3 | 9.1 | 7.66 | 5.82 | 490 | 7 | 1.44 | 24 |

Referring to Table 1, Examples 1 to 8 including the second polybenzoxazole precursor, compound as a dissolution controlling agent have much decreased thickness change compared with Comparative Examples 1 to 3. They also have excellent photo characteristics in terms of sensitivity, resolution, contraction rate, film thickness decrease during development, and the like.

In order to measure mechanical properties of a cured film, a silicon wafer covered with the cured film is dipped in a 2% hydrofluoric acid (HF) solution for 30 minutes. Then, the film is separated therefrom and cut to a 6.0 cm*1.0 cm ribbon shape, which is used as a specimen. This specimen is used to evaluate mechanical properties such as tensile strength, elongation, Young's modulus, and the like by using a multipurpose tester (Instron series IX). The results are provided in Table 2.

TABLE 2

| | Tensile strength (kgf/mm²) | Elongation (%) | Young's modulus (kgf/mm²) |
|---|---|---|---|
| Example 1 | 12.0 | 65 | 230 |
| Example 2 | 11.7 | 47 | 220 |
| Example 3 | 12.5 | 55 | 225 |
| Example 4 | 12.1 | 75 | 235 |
| Example 5 | 11.9 | 53 | 218 |
| Example 6 | 12.2 | 67 | 230 |
| Example 7 | 11.8 | 54 | 220 |
| Example 8 | 12.4 | 57 | 220 |
| Comparative Example 1 | 10.9 | 9 | 209 |
| Comparative Example 2 | 10.2 | 7 | 199 |
| Comparative Example 3 | 9.9 | 8 | 205 |

Referring to Table 2, the photosensitive resin compositions of Examples 1 to 8 have excellent mechanical properties, and particularly remarkable elongation compared with the ones of Comparative Examples 1 to 3.

In addition, they have excellent mechanical properties, compared with the ones including a phenol-based dissolution controlling agent or no dissolution controlling agent according to Comparative Examples 1, 2, and 3.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A positive photosensitive resin composition comprising:
   (A) a first polybenzoxazole precursor that includes a repeating unit of the following Chemical Formula 1, and a thermally polymerizable functional group at at least one terminal end;
   (B) a second polybenzoxazole precursor that includes a repeating unit of the following Chemical Formula 3;
   (C) a photosensitive diazoquinone compound;
   (D) a silane compound; and
   (E) a solvent:

[Chemical Formula 1]

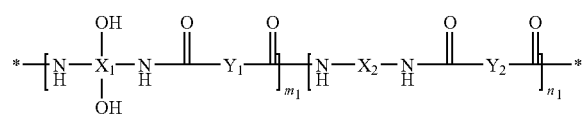

wherein, in the above Chemical Formula 1,
X1 is an aromatic organic group or a tetravalent to hexavalent alicyclic organic group,
Y1 and Y2 are the same or different, and are independently an aromatic organic group or a divalent to hexavalent alicyclic organic group, X2 is an aromatic organic group, a divalent to hexavalent alicyclic organic group, or a functional group represented by the following Formula 2,
m1 and n1 are each mole ratios, and m1+n1 is 100%,
m1 ranges from about 60 to about 100 mol %, and
n1 ranges from about 0 to about 40 mol %:

[Chemical Formula 2]

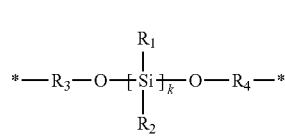

wherein, in the above Chemical Formula 2,
R1 to R2 are the same or different, and are independently substituted or unsubstituted alkyl, substituted or unsubstituted aryl, substituted or unsubstituted alkoxy, or hydroxy,
R3 and R4 are the same or different, and are independently substituted or unsubstituted alkylene or substituted or unsubstituted arylene, and
k is an integer ranging from 1 to 50;

[Chemical Formula 3]

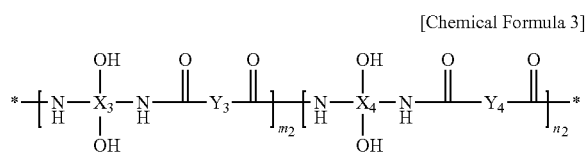

wherein, in the above Chemical Formula 3,
X3 and X4 are the same or different, and are independently an aromatic organic group or a tetravalent to hexavalent alicyclic organic group,
Y3 is an aromatic organic group or a divalent to hexavalent alicyclic organic group, and wherein Y3 further includes a thermally polymerizable organic group,
Y4 is an aromatic organic group or a divalent to hexavalent alicyclic organic group,
m2 and n2 are each mole ratios, and m2+n2 is 100 mol %,
m2 ranges from about 50 to about 100 mol %, and
n2 ranges from about 0 to about 50 mol %.

2. The positive photosensitive resin composition of claim 1, wherein the first polybenzoxazole precursor has a weight average molecular weight (Mw) of about 3000 to about 300,000.

3. The positive photosensitive resin composition of claim 1, wherein the second polybenzoxazole precursor comprises a thermally polymerizable functional group at at least one terminal end.

4. The positive photosensitive resin composition of claim 1, wherein the second polybenzoxazole precursor has a weight average molecular weight (Mw) of about 3000 to about 300,000.

5. The positive photosensitive resin composition of claim 1, wherein the solvent comprises N-methyl-2-pyrrolidone, γ-butyrolactone, N,N-dimethyl acetamide, dimethylsulfoxide, diethyleneglycol dimethylether, diethylene glycol diethylether, diethyleneglycol dibutylether, propyleneglycol monomethylether, dipropyleneglycol monomethylether, propyleneglycol monomethyletheracetate, methyl lactate, ethyl lactate, butyl lactate, methyl-1,3-butyleneglycolacetate, 1,3-butyleneglycol-3-monomethylether, methyl pyruvate, ethyl pyruvate, methyl-3-methoxy propionate, or a combination thereof.

6. The positive photosensitive resin composition of claim 1, wherein the resin composition comprises:
- about 1 to about 30 parts by weight of the second polybenzoxazole precursor (B);
- about 5 to about 100 parts by weight of the photosensitive diazoquinone compound (C);
- about 0.1 to about 30 parts by weight of the silane compound (D); and
- about 100 to about 400 parts by weight of the solvent (E), each based on about 100 parts by weight of the first polybenzoxazole precursor (A).

7. A photosensitive resin film fabricated using the positive photosensitive resin composition according to claim 1.

8. A semiconductor device comprising the photosensitive resin film according to claim 7.

* * * * *

UNITED STATES PATENT AND TRADEMARK OFFICE
CERTIFICATE OF CORRECTION

PATENT NO. : 8,198,002 B2
APPLICATION NO. : 12/581974
DATED : June 12, 2012
INVENTOR(S) : Doo-Young Jung et al.

Page 1 of 1

It is certified that error appears in the above-identified patent and that said Letters Patent is hereby corrected as shown below:

In the Specification:

Column 13, Line 22 reads "$n_{13}$, $n_{14}$, $n_{17}$, and $\cancel{n_{15}}$ are the same or different and are" and should read "$n_{13}$, $n_{14}$, $n_{17}$, and $\underline{n_{18}}$ are the same or different and are"

In the Claims:

Column 34, Claim 1, Line 4 reads "m1 and n1 are each mole ratios, and m1+n1 is 100%," and should read "m1 and n1 are each mole ratios, and m1+n1 is 100 $\underline{mol}$ %,"

Signed and Sealed this
Second Day of October, 2012

David J. Kappos
*Director of the United States Patent and Trademark Office*